US011683033B2

(12) United States Patent
Sreeramaneni et al.

(10) Patent No.: US 11,683,033 B2
(45) Date of Patent: *Jun. 20, 2023

(54) APPARATUSES AND METHODS FOR COMPENSATING FOR CROSSTALK NOISE AT INPUT RECEIVER CIRCUITS

(71) Applicant: Micron Technology, Inc., Boise, ID (US)

(72) Inventors: Raghukiran Sreeramaneni, San Jose, CA (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/687,959

(22) Filed: Mar. 7, 2022

(65) Prior Publication Data

US 2022/0239292 A1 Jul. 28, 2022

Related U.S. Application Data

(63) Continuation of application No. 17/160,204, filed on Jan. 27, 2021, now Pat. No. 11,296,693.

(51) Int. Cl.
*H03K 5/00* (2006.01)
*H03K 17/687* (2006.01)
(Continued)

(52) U.S. Cl.
CPC ...... *H03K 17/6871* (2013.01); *G11C 11/4093* (2013.01); *H03K 5/01* (2013.01); *H03K 5/1252* (2013.01)

(58) Field of Classification Search
CPC ..... H03K 5/01; H03K 17/6871; H03K 5/1252
See application file for complete search history.

(56) References Cited

U.S. PATENT DOCUMENTS 4,136,292 A 1/1979 Suzuki et al.
5,821,824 A 10/1998 Mentzer
(Continued)

FOREIGN PATENT DOCUMENTS

KR 20040069826 A 8/2004
WO WO/2022/164604 8/2022

OTHER PUBLICATIONS

International Search Report/Written Opinion dated Apr. 27, 2022 for PCT Appl. No. PCT/US2022/011176; pp. all.
(Continued)

*Primary Examiner* — Tuan T Lam
(74) *Attorney, Agent, or Firm* — Dorsey & Whitney LLP

(57) ABSTRACT

An input receiver circuit for a signal line may receive inputs from other signal lines to mitigate crosstalk noise present on the signal line. In some examples, the input receiver circuit may include a transistor with a programmable width. In some examples, the input receiver circuit may include a bias current generator with a programmable current. The width and/or current may be programmed based on an amount of crosstalk noise introduced by the other signal line. In some examples, the input receiver circuit may include a resistance and/or a capacitance. In some examples the resistor and/or capacitor may be programmable. The resistance and/or capacitance may be programmed based on a duration of the crosstalk noise on the signal line.

18 Claims, 11 Drawing Sheets

(51) Int. Cl.
*G11C 11/4093* (2006.01)
*H03K 5/1252* (2006.01)
*H03K 5/01* (2006.01)

(56) References Cited

U.S. PATENT DOCUMENTS

| | | | | |
|---|---|---|---|---|
| 6,064,713 | A * | 5/2000 | Lebrun | G09G 3/3677 377/67 |
| 6,225,863 | B1 | 5/2001 | Miwa | |
| 6,327,185 | B1 | 12/2001 | Hirata | |
| 6,556,646 | B1 * | 4/2003 | Yeo | G09G 3/3677 377/64 |
| 7,289,594 | B2 * | 10/2007 | Moon | G11C 19/00 377/68 |
| 9,116,535 | B2 | 8/2015 | Park et al. | |
| 11,296,693 | B1 | 4/2022 | Sreeramaneni et al. | |
| 2006/0214689 | A1 | 9/2006 | Byun et al. | |
| 2006/0233278 | A1 | 10/2006 | Zerbe et al. | |
| 2007/0109058 | A1 | 5/2007 | Kim et al. | |
| 2008/0272821 | A1 | 11/2008 | Miura et al. | |
| 2011/0128768 | A1 * | 6/2011 | Shimizu | G11C 29/028 365/207 |
| 2012/0086488 | A1 | 4/2012 | Willey | |
| 2016/0065199 | A1 | 3/2016 | Hagiwara | |
| 2016/0087633 | A1 | 3/2016 | Zhang et al. | |
| 2017/0054448 | A1 | 2/2017 | Lye et al. | |
| 2019/0287603 | A1 | 9/2019 | Antonyan et al. | |

OTHER PUBLICATIONS

PCT Application PCT/US22/11176 titled "Apparatuses and Methods for Compensating for Crosstalk Noise at Input Receiver Circuits" filed Jan. 4, 2022, pp. all pages of the application as filed.

U.S. Appl. No. 17/160,204 titled "Apparatuses and Methods for Compensating for Crosstalk Noise at Input Receiver Circuits" filed Jan. 27, 2021, pp. all pages of the application as filed.

* cited by examiner

APPARATUSES AND METHODS FOR COMPENSATING FOR CROSSTALK NOISE AT INPUT RECEIVER CIRCUITS

CROSS REFERENCE TO RELATED APPLICATION(S)

This application is a continuation of U.S. patent application Ser. No. 17/160,204 filed Jan. 27, 2021 and issued as U.S. Pat. No. 11,296,693 on Apr. 5, 2022, The aforementioned application, and issued patent, is incorporated herein by reference, in its entirety, for any purpose.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, memory addresses signals, and clocks. The various command and address signals, and clocks may be provided by a memory controller, for example. The command signals may control the semiconductor memories to perform various memory operations, for example, a read operation to retrieve data from a memory, and a write operation to store data to the memory. Data signals may be provided between the controller and memories with known timing relative to receipt by the memory of an associated command.

With newly developed memories, the memories may be provided with system clocks that are used for timing the commands and addresses, for example, and further provided with data clocks that are used for timing of read data provided by the memory and for timing of write data provided to the memory. The memories may also provide clocks to the controller for timing provision of data provided to the controller.

The external clocks provided to the memories are used to provide internal clocks that control the timing of various internal circuits during a memory operation. For example, the internal clocks may be used to clock input circuits to receive the various signals provided to the memories, such as the command and address signals, and data signals on various signal lines. Input receivers of the input circuits receive and capture the input signals from the signal lines. Signals provided on one signal line may generate noise on another signal line, referred to as crosstalk noise. The crosstalk noise may affect signal integrity of the input signals and may cause the input receivers to capture erroneous commands, addresses, and/or data.

DETAILED DESCRIPTION

Apparatuses and methods, including circuits, timing, and operating parameters, for reducing the effect of crosstalk between signal lines are disclosed. As explained herein, an input receiver circuit for a signal line may receive input signals from one or more other signal lines. Signals on the other signal lines may contribute to crosstalk noise in the input signal on the signal line. The input signals from the other signal lines may be used by the input receiver circuit to reduce or eliminate the effect of crosstalk noise on the input signal on the signal line. In some applications, this may reduce reduction of the data eye of the input signal on the signal line caused by crosstalk noise.

Figure 1:
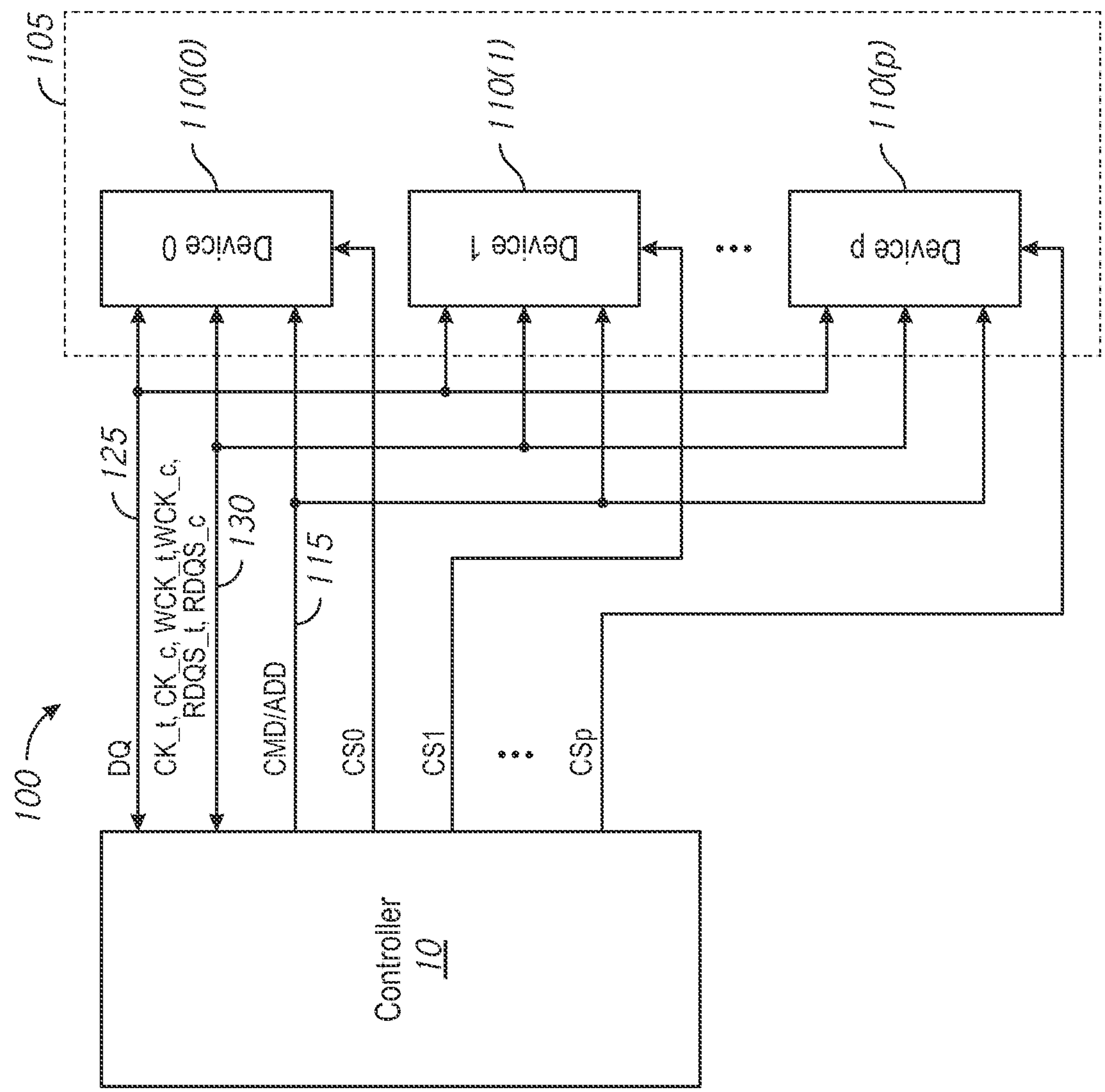
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(*p*) (e.g., "Device 0" through "Device p"), where p is a natural number. The memories 110 may be dynamic random access memory (DRAM) in some embodiments. The memories 110 may be double data rate (DDR) DRAM in some embodiments. The controller 10 and the memory system 105 are in communication over one or more busses. The memories 110(0)-110(*p*) may be each coupled to the command/address, data, and clock busses. In the example shown in FIG. 1, commands and addresses are received by the memory system 105 on a command/address bus 115, and data is provided between the controller 10 and the memory system 105 over a data bus 125. Various clocks may be provided between the controller and memory system 105 over a clock bus 130. The clock bus 130 may include signal lines for providing system clocks CK_t and CK_c received by the memory system 105, data clock WCK_t and WCK_c received by the memory system 105, and access data clocks RDQS_t and RDQS_c provided by the memory system 105 to the controller 10. Each of the busses may include one or more signal lines on which signals are provided.

The CK_t and CK_c clocks provided by the controller 10 to the memory system 105 are used for timing the provision and receipt of the commands and addresses. The WCK_t and WCK_c clocks and the RDQS_t and RDQS_c clocks are used for timing provision of data. The CK_t and CK_c clocks are complementary, the WCK_t and WCK_c clocks are complementary, and the RDQS_t and RDQS_c clocks are complementary. Clocks are complementary when a rising edge of a first clock occurs at a same time as a falling edge of a second clock, and when a rising edge of the second clock occurs at a same time as a falling edge of the first clock.

The controller 10 provides commands to the memory system 105 to perform memory operations. Examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clocks, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 110 is selected to receive the commands and addresses provided on the command/address bus 115.

In operation, when a read command and associated address are provided by the controller 10 to the memory system 105, the memory 110 selected by the select signals receives the read command and associated address, and performs a read operation to provide the controller 10 with read data from a memory location corresponding to the associated address. The read data is provided by the selected memory 110 to the controller 10 according to a timing relative to receipt of the read command. For example, the timing may be based on a read latency (RL) value that indicates the number of clock cycles of the CK_t and CK_c clocks (a clock cycle of the CK_t and CK_c clocks is referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting various operating modes and/or to select features for operation of the memories. One of the settings may be for the RL value.

In preparation of the selected memory 110 providing the read data to the controller 10, the controller provides active WCK_t and WCK_c clocks to the memory system 105. The WCK_t and WCK_c clocks may be used by the selected memory 110 to generate access data clocks RDQS_t and RDQS_c. A clock is active when the clock transitions between low and high clock levels periodically. Conversely, a clock is inactive when the clock maintains a constant clock level and does not transition periodically. The RDQS_t and RDQS_c clocks are provided by the memory 110 performing the read operation to the controller 10 for timing the provision of read data to the controller 10. The controller 10 may use the RDQS_t and RDQS_c clocks for receiving the read data.

In operation, when a write command and associated address are provided by the controller 10 to the memory system 105, the memory 110 selected by the select signals receives the write command and associated address, and performs a write operation to write data from the controller 10 to a memory location corresponding to the associated address. The write data is provided to the selected memory 110 by the controller 10 according to a timing relative to receipt of the write command. For example, the timing may be based on a write latency (WL) value that indicates the number of clock cycles of the CK_t and CK_c clocks after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK_t and WCK_c clocks to the memory system 105. The WCK_t and WCK_c clocks may be used by the selected memory 110 to generate internal clocks for timing the operation of circuits to receive the write data. The data is provided by the controller 10 and the selected memory 110 receives the write data according to the WCK_t and WCK_c clocks, which is written to memory corresponding to the memory addresses.

Figure 2:
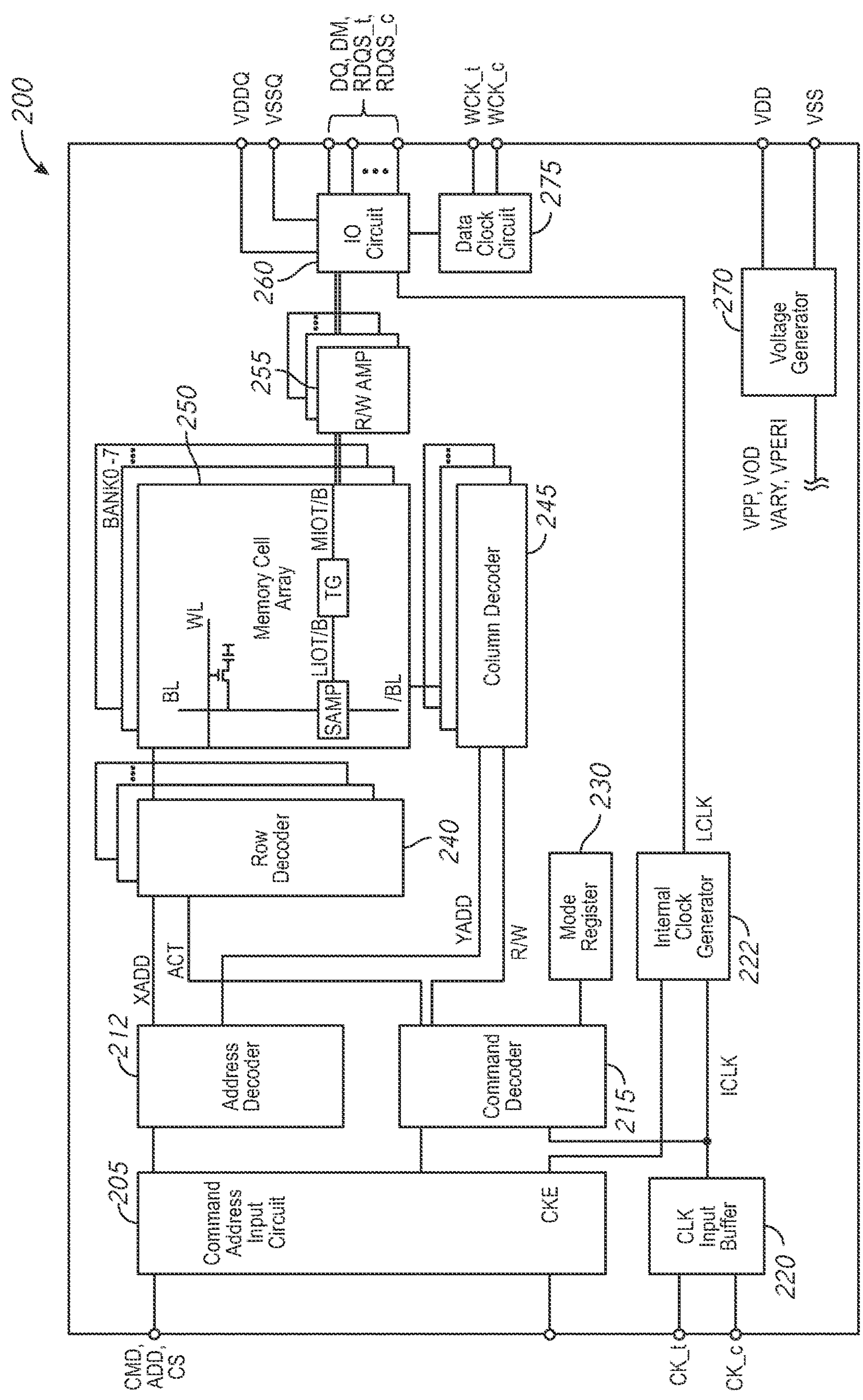
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. The semiconductor device 200 may include, without limitation, a DRAM device. The semiconductor device 200 may be integrated into a single semiconductor chip in some embodiments of the disclosure. In some embodiments, the semiconductor device 200 may be included in memory 110 of FIG. 1.

The semiconductor device 200 includes a memory array 250. The memory array 250 is shown as including a plurality of memory banks. In the embodiment of FIG. 2, the memory array 250 is shown as including eight memory banks BANK0-BANK7. Each memory bank includes a plurality of word lines WL, a plurality of bit lines BL and BL, and a plurality of memory cells MC arranged at intersections of the plurality of word lines WL and the plurality of bit lines BL and/BL. Selection of the word line WL is performed by a row decoder 240 and selection of the bit lines BL and/BL is performed by a column decoder 245. In the embodiment of FIG. 2, the row decoder 240 includes a respective row decoder for each memory bank and the column decoder 245 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 255 over complementary local data lines (LIOT/B), transfer gate (TG), and complementary main data lines (MIOT/B). Conversely, write data outputted from the read/write amplifiers 255 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address and chip select (CAICS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ and DM, and power supply terminals to receive power supply potentials VDD, VSS, VDDQ, and VSSQ.

The clock terminals are supplied with external clocks CK_t and CK_c that are provided to an input buffer 220. The external clocks may be complementary. The input buffer 220 generates an internal clock ICLK based on the CK_t and CK_c clocks. The ICLK clock is provided to the command decoder 215 and to an internal clock generator 222. The internal clock generator 222 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 275, which generates internal data clocks based on the WCK_t and WCK_c clocks. The internal data clocks are provided to the input/output circuit 260 to time operation of circuits included in the input/output circuit 260, for example, to input receiver circuits (not shown in FIG. 2, see e.g., FIG. 3) to time the receipt of write data.

The CA/CS terminals may be supplied with memory addresses. The memory addresses supplied to the CA/CS terminals are transferred, via a command/address input circuit 205, to an address decoder 212. The address decoder 212 receives the address and supplies a decoded row address XADD to the row decoder 240 and supplies a decoded column address YADD to the column decoder 245. The CA/CS terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 215 via the command/address input circuit 205. The command decoder 215 includes circuits to decode the internal command signals to generate various internal signals and commands for performing operations. For example, the command decoder 215 may provide a row command signal ACT to select a word line and a column command signal R/W to select a bit line.

The power supply terminals are supplied with power supply potentials VDD and VSS. The power supply potentials VDD and VSS are supplied to an internal voltage generator circuit 270. The internal voltage generator circuit 270 generates various internal potentials VPP, VOD, VARY, VPERI, and the like based on the power supply potentials VDD and VSS supplied to the power supply terminals. The internal potential VPP is mainly used in the row decoder 240, the internal potentials VOD and VARY are mainly used in the sense amplifiers SAMP included in the memory array 250, and the internal potential VPERI is used in many peripheral circuit blocks.

The power supply terminals are also supplied with power supply potentials VDDQ and VSSQ. The power supply potentials VDDQ and VSSQ are supplied to the input/output circuit 260. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 260 so that power supply noise generated by the input/output circuit 260 does not propagate to the other circuit blocks.

When a read command is received, and a row address and a column address are timely supplied with the read command, read data is read from memory cells in the memory array 250 corresponding to the row address and column address. The read command is received by the command decoder 215, which provides internal commands so that read data from the memory array 250 is provided to the read/write amplifiers 255. The read data is output to outside from the data terminals DQ via the input/output circuit 260. The RDQS_t and RDQS_c clocks are provided externally from clock terminals for timing provision of the read data by the input/output circuit 260. The external terminals DQ include several separate terminals, each providing a bit of data synchronized with a clock edge of the RDQS_t and RDQS_c clocks.

When the write command is received, and a row address and a column address are timely supplied with the write command, write data supplied to the data terminals DQ is written to a memory cells in the memory array 250 corresponding to the row address and column address. A data mask may be provided to the data terminals DM to mask portions of the data when written to memory. The write command is received by the command decoder 215, which provides internal commands so that the write data is received by input receivers in the input/output circuit 260. WCK_t and WCK_c clocks are also provided to the external clock terminals for timing the receipt of the write data by the input receivers of the input/output circuit 260. The write data is supplied via the input/output circuit 260 to the read/write amplifiers 255, and by the read/write amplifiers 255 to the memory array 250 to be written into the memory cell MC. As previously described, the external terminals DQ include several separate terminals. With reference to a write operation, each external terminal DQ concurrently receives a bit of data synchronized with a clock edge of the WCK_t and WCK_c clocks.

Various ones of the previously described circuits may include input receiver circuits (also referred to as input receivers) that are used to receive input signals. For example, input receivers may be included in the command/address input circuit 205 to receive command and address signals, and to receive select signals. In another example, input receivers may be included in the input/output circuit 260 to receive data signals and/or signals related to data signals (e.g., data mask signals DM, error correction code signals, including parity signals, data bus inversion signals, etc.). The input receivers may receive input signals as timed by clocks. For example, the clocks CK_t and CK_c (or clocks based on the CK_t and CK_c clocks) may be used for input receivers used to receive command and address signals, and/or input receivers used to receive select signals. In another example, the clocks WCK_t and WCK_c (or clocks based on the WCK_t and WCK_c clocks) may be used for input receivers used to receive data signals (or signals related to data signals). As previously mentioned, input receivers may capture valid input signals when the input signal meets a specification that defines characteristics (e.g., voltage and/or timing characteristics) of the input signals. As an example, an input signal may include a time-variant voltage characteristic that is based at least in part on predefined characteristics. For example, the predefined characteristic, referred to as a "data eye," may specify voltage and/or times in which a signal must be present in order to be guaranteed to be successfully captured by an input receiver. In another example, the predefined characteristic, referred to as a "receiver mask," may specify voltage and/or times in which a signal must not be present in order to be guaranteed to be successfully captured by an input receiver. Other predefined characteristics may be used in other examples. Input signals that do not meet the specification cannot be guaranteed to be successfully captured by the input receivers.

Figure 3:
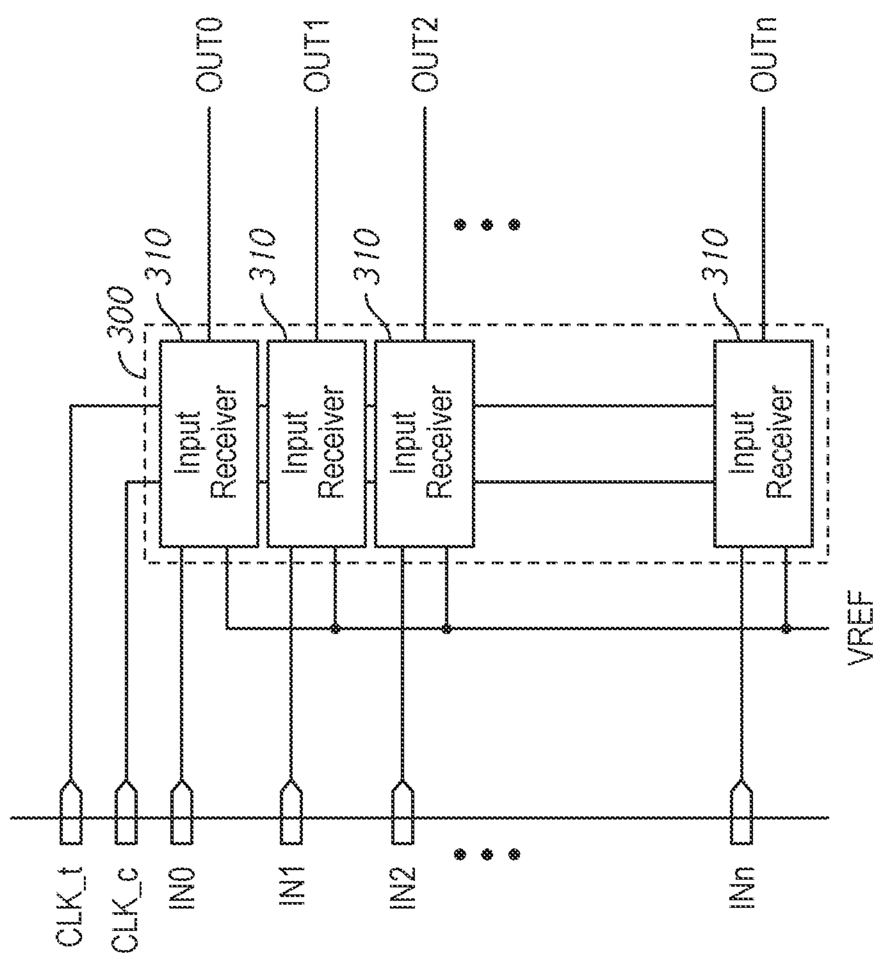
FIG. 3 is a block diagram of input circuits according to an embodiment of the disclosure.

FIG. 3 is a block diagram of an input circuit 300 according to an embodiment of the disclosure. The input circuit 300 may be included in an input/output circuit. In some embodiments of the disclosure the input circuit 300 is included in the input/output circuit 260 of the semiconductor device 200 FIG. 2. The input circuit 300 may be provided input signals IN0-INn from external terminals, where n is a natural number. In various embodiments of the disclosure, the input signals may be, for example, command and address signals, select signals, input signals, and/or data signals.

The input circuit 300 may be further provided clocks CLK_t and CLK_c. The CLK_t and CLK_c clocks may be complementary. The CLK_t and CLK_c clocks may cause the input circuit 300 to capture the IN0-INn signals, thereby controlling a timing of the input circuit 300. The CLK_t and CLK_c clocks may be, for example, system clocks CK_t and CK_c, data clocks WCK_t and WCK_c, and/or clocks based on system clocks, data clocks, etc. in various embodiments of the disclosure.

The input circuit 300 includes input receiver circuits 310 that receive respective IN signals from the external terminals. Each of the input receivers 310 is caused by the CLK_t and CLK_c clocks to capture the respective IN signal. The input receivers 310 further receive a reference voltage VREF. The input receivers 310 compare a voltage of the respective IN signal to the VREF signal to determine a logic level of the respective IN signal and provide a respective output signal OUT having a voltage corresponding to a logic level that is based on the comparison. For example, an input signal having a voltage that is greater than the VREF voltage when captured by an input receiver is determined as a 1 logic level, and conversely, an input signal having a voltage that is less than the VREF voltage when captured by the input receiver is determined as a 0 logic level. In some examples, the input receiver 310 may include a differential pair circuit (not shown in FIG. 3), where one side receives the respective IN signal as an input and the other side receives the VREF as an input. The output of the differential pair may be used by the input receiver 310 to generate the respective output signal OUT. In some examples, the output of the differential pair may be a differential signal. The resulting respective output signals OUT provided by the input receivers have voltages that correspond to logic levels that are based on the logic levels of the respective input signals. The OUT signals may be provided to internal circuits for further operations, for example, other circuits included in the input/output circuit and/or read amplifiers, such as read amplifiers 255.

As memory devices decrease in size, the size and spacing of the conductive paths (also referred to as signal lines) transmitting input signals IN0-INn have also decreased. Increases in the number of input signals IN0-INn may also contribute to the reduction in size and spacing of the conductive paths. This may increase the risk of capacitive coupling and/or other interference between the signal lines.

Figure 4B:
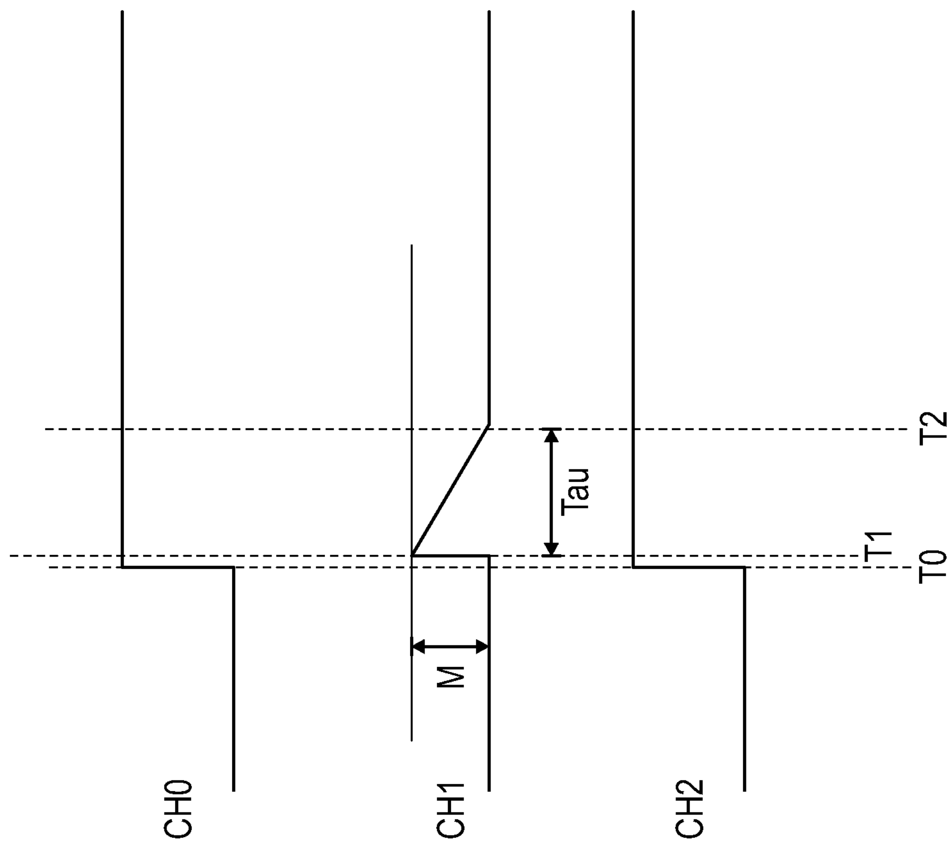
FIG. 4B is a timing diagram illustrating states of signals on the signal lines shown in FIG. 4A.
Figure 4A:
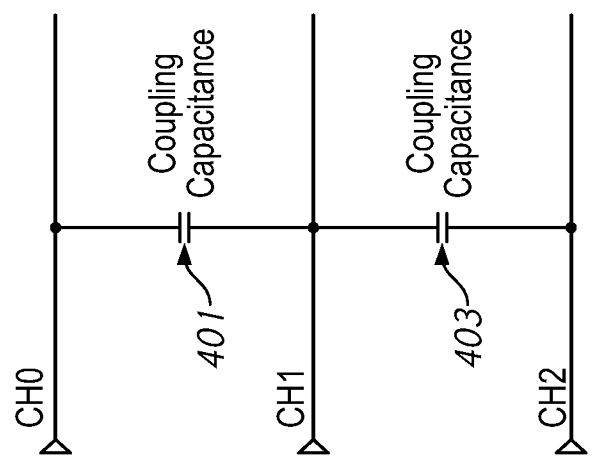
FIG. 4A is an illustration of portions of signal lines.

FIG. 4A is an illustration of portions of signal lines. The signal lines CH0-2 may provide input signals, such as input signals IN0-INn shown in FIG. 3 in some embodiments. In some examples, the signal lines CH0-2 may be data signal lines that provide data input signals. As noted, signal lines CH0-2 may be routed and/or sized in such a manner that capacitive coupling may occur between one or more of the signal lines CH0-2. In the example shown in FIG. 4A, capacitive coupling between signal line CH1 and adjacent signal lines CH0, CH2 is illustrated as capacitances 401 and 403, respectively. The capacitive coupling of signal line CH0 and/or signal line CH2 to signal line CH1 may cause distortions in the input signal provided by signal line CH1. The distortions to the input signal on a signal line caused by capacitive coupling to other signal lines may be referred to as crosstalk noise or simply crosstalk.

FIG. 4B is a timing diagram illustrating states of signals on the signal lines shown in FIG. 4A. In the example shown in FIG. 4B, prior to time T0 the signals on signal lines CH0-2 are in a "low" state (e.g., low voltage, logic '0'). At or around time T0, signal line CH0 and signal line CH2 are driven to provide signals with a "high" state (e.g., high voltage, logic '1'). Signal lines CH0 and CH2 may be driven by a host system and/or controller, such as controller 10 shown in FIG. 1, or responsive to commands or other signals provided by the host system and/or controller.

Although signal line CH1 is not driven to the high state at or around time T0 (e.g., the signal provided to signal line CH1 remains at the low state), due to the capacitive coupling with signal line CH0 and/or signal line CH2, at or around time T1, signal line CH1 is momentarily driven to a level greater than the low state, altering the apparent signal on signal line CH1. In other words, noise is added to the signal on signal line CH1. In some instances, the level may be equal to the high state on signal lines CH0 and CH2. In other instances, the level may be between the low and high states of the signals. The noise added to the signal on signal line CH1 by the signals on signal lines CH0 and CH2 is referred to as crosstalk noise.

The amount the signal on signal line CH1 deviates from the "true" signal on signal line CH1 may be the magnitude M of the crosstalk noise. The crosstalk noise on signal line CH1 may be transient and dissipate over time. The signal on signal line CH1 may return to its state after a recovery time Tau. In the example shown in FIG. 4B, the signal on signal line CH1 returns to its true low state at or around time T2. However, depending on the magnitude M of the crosstalk noise, the length of the recovery time Tau, and/or when the crosstalk noise occurs, an input receiver (e.g., input receiver 310) receiving the signal on signal line CH1 may not capture the signal properly. For example, the input receiver may incorrectly capture a logic level associated with the high state instead of a logic level associated with the low state.

An input receiver may include a differential pair circuit, where the input signal on signal line CH1 is compared to a reference signal, such as reference voltage VREF, and a difference between the input signal and the reference signal is used to determine a logic state of the input signal and/or determine a logic state of a signal to be output by the input receiver (e.g., OUT0-OUTn) based on the input signal. The crosstalk noise on signal line CH1 may cause the difference between the input signal and the reference signal to indicate a different logic state than the difference between the true input signal and the reference signal without the crosstalk noise.

The crosstalk noise shown in FIG. 4B is merely one example, and many other examples of crosstalk noise may occur on signal line CH1. For example, crosstalk noise may occur on signal line CH1 even when only one of signal lines CH0 and CH2 is driven high. In another example crosstalk noise may occur when the signal on signal line CH1 is at a high state and the signal on signal line CH0 and/or signal line CH2 are driven low. In a further example, crosstalk may occur even when signal lines CH0 and CH2 are driven in different directions (e.g., one signal line driven high while the other is driven low). Additionally, although only crosstalk between directly adjacent signal lines are shown in the example of FIG. 4B, a signal line may be capacitively coupled to signal lines with other spatial relationships instead of or in addition to directly adjacent signal lines. Additionally, signal lines capacitively coupled to a signal line may not influence the signal line equally (e.g., signal line CH0 may cause greater crosstalk noise on signal line CH1 than signal line CH2). Finally, although only three signal lines are shown in FIGS. 4A and 4B, it is understood that a memory device may include one, two, or more than three signal lines (e.g., 16, 32, 64, 128, 256, etc.). As a result, signal lines CH0 and CH2 may themselves be subject to crosstalk noise due to other adjacent signal lines (not shown). Furthermore, in some applications, other factors other than or in addition to capacitive coupling may contribute to crosstalk noise.

As previously described, input receiver circuits receive an input signal when clocked by a clock. The input signal should meet a specification that defines characteristics of the input signal for the input receivers to capture the input signal (e.g., accurately capture the data of the input signal). Input signals that do not meet the specification cannot be guaranteed to be successfully captured by the input receivers. Crosstalk noise may cause input signals to fail to meet the specification(s). For example, as described with reference to FIG. 4B, crosstalk noise may cause an incorrect logic state to be captured by the input receiver.

As signal speeds (e.g., clock speeds) increase and/or voltage ranges decrease, the specifications for input signals may become more difficult to meet. Furthermore, as memories decrease in size and/or increase in bandwidth, the size of signal lines and/or spacing between signal lines may decrease. This may increase crosstalk noise in the signal lines, which may prevent input signals from meeting the specifications for proper capture by input receivers.

As described in more detail herein, for example, with reference to FIGS. 5-11, an input receiver circuit according to embodiments of the present disclosure may reduce or eliminate the influence of crosstalk on an input signal line received by the input receiver. In some embodiments, an input receiver circuit for a signal line may receive input signals from one or more other signal lines. In some embodiments, the other signal lines may be signal lines that are adjacent to the signal line. The input receiver circuit may use the input signals from the one or more other signal lines to generate a mitigation signal that may be used to reduce or eliminate the influence of crosstalk on an input signal. For example, in some embodiments of the disclosure the mitigation signal generated matches (e.g., equals or approximates) the crosstalk noise on the signal line. In some embodiments, the mitigation signal generates an effect that cancels (or nearly cancels) an effect of the cross talk noise on the signal line. In some embodiments, the mitigation signal may be provided to a reference side of a differential pair circuit of the input receiver circuit (e.g., a side receiving a reference signal, such as a reference voltage VREF). The other side of the differential pair may receive an input signal on the signal line (e.g., input side), which may be distorted by crosstalk noise (e.g., crosstalk noise is present on the signal line). In some applications, by providing a signal that matches the crosstalk noise on the signal line to the reference side of the differential pair, the influence of the crosstalk noise on the input signal on the signal line may be reduced or eliminated. For example, in some applications, this may prevent the input receiver circuit from determining/capturing an incorrect logic state of the input signal on the signal line. In some applications, this may increase the effective data eye and/or decrease the effective receiver mask.

In some embodiments, an input receiver circuit for a signal line may include devices for receiving inputs from other signal lines. In some embodiments, one or more of the devices may be programmable. In some embodiments, the programming of one or more devices may determine an amount of influence a signal from another signal line has on a magnitude (e.g., magnitude M in FIG. 4B) of a mitigation signal generated by the input receiver circuit. The amount of influence may be based, at least in part, on a degree of capacitive coupling between the signal line and the other signal line. In other words, the amount of influence may be based, at least in part, on a degree the signal from the other signal line contributes to the crosstalk noise on the signal line. In some embodiments, programming one or more devices may determine a period of time the mitigation signal is provided. In some embodiments, the period of time the mitigation signal is provided is equal to (or approximately equal to) a recovery time of an input signal on the signal line (e.g., recovery time Tau in FIG. 4B).

Figure 5:
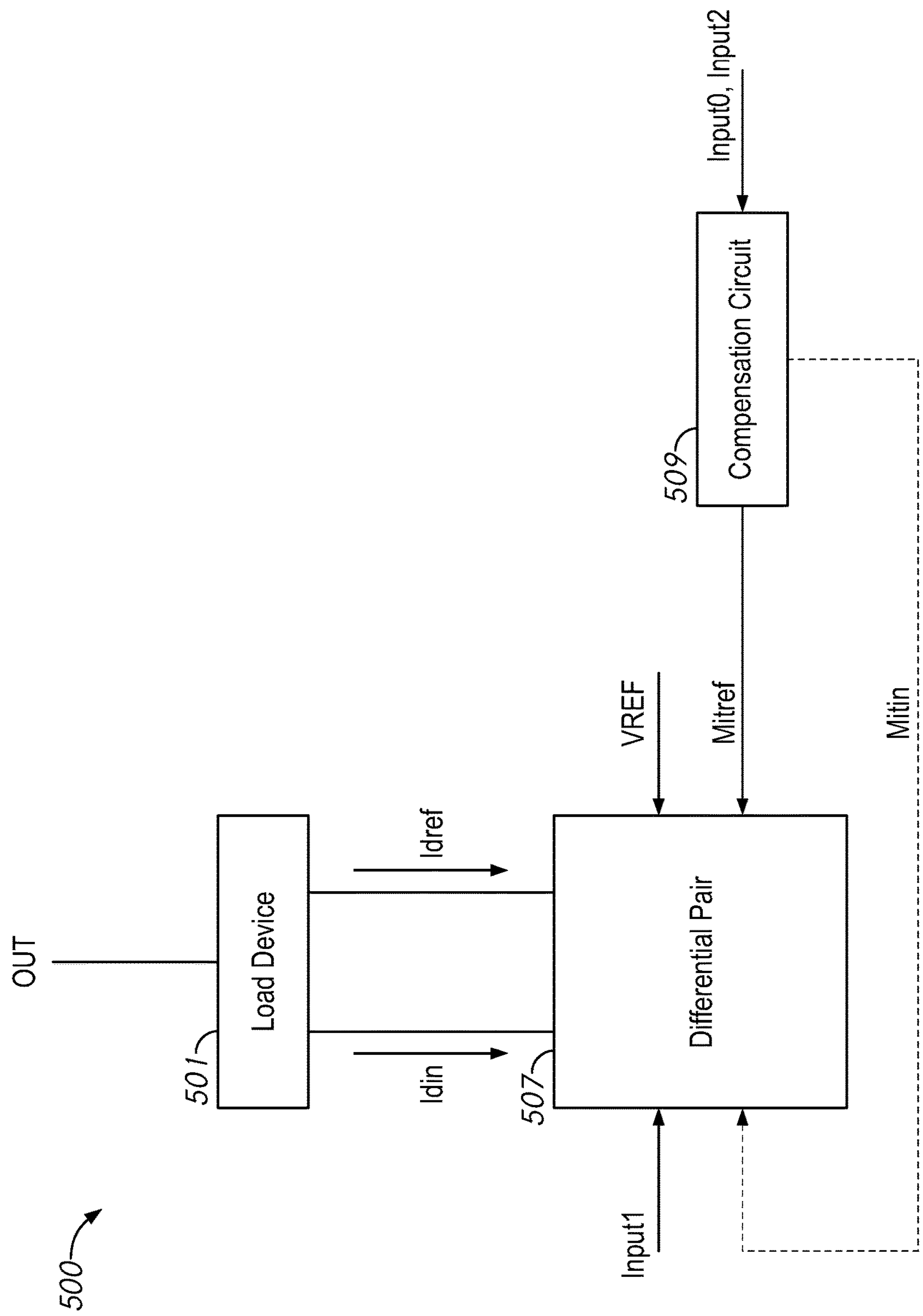
FIG. 5 is a block diagram of at least a portion of an input receiver circuit according to an embodiment of the present disclosure

FIG. 5 is a block diagram of at least a portion of an input receiver circuit according to an embodiment of the present disclosure. In some embodiments, the input receiver circuit 500 may be included in input receiver circuit 310. The input receiver circuit 500 may include a differential pair circuit 507 coupled to a load device 501. The load device 501 may include one or more resistors, latches, transistors, and/or other devices. The load device 501 may receive a differential signal from the differential pair circuit 507. In the example shown in FIG. 5, the differential signal includes an input current Idin based, at least in part, on an input signal Input1 provided on a signal line and a reference current Idref based, at least in part, on a reference voltage VREF. The load device 501 may provide an output signal OUT. In some embodiments, the output signal may be based, at least in part, on the differential signal provided by the differential pair. In some examples, the output signal OUT may have a voltage level indicating a logic level, similar to the output signals OUT0-OUTn shown in FIG. 3. In other examples, the output signal OUT may be provided to other components of the input receiver circuit 500 not shown that generate an output signal indicative of a logic level.

In ideal operation, the input current Idin may vary based on the state of the input signal Input1 while the reference current Idref remains constant. Thus, a difference between Idin and Idref is indicative of the input signal Input1. However, the input current Idin may vary not only based on the true input signal Input1, but also due to crosstalk noise. Thus, a difference between the input current Idin and reference current Idref may not reflect a true state of the input signal Input1.

To compensate for the crosstalk noise, the input receiver circuit may include a compensation circuit 509. The compensation circuit 509 may receive one or more input signals from other signal lines that contribute to the crosstalk on the signal line providing input signal Input1. In the example shown in FIG. 5, the compensation circuit 509 receives two input signals Input0 and Input2. However, in other examples, the compensation circuit 509 may receive input signals from one signal line or more than two signal lines.

The compensation circuit 509 may generate one or more mitigation signals based on the input signals Input0 and Input2. In some embodiments, a mitigation signal Mitref may be provided to the reference side of the differential pair. The mitigation signal Mitref may cause the reference current Idref to vary in a manner that equals or approximates the manner in which the crosstalk noise causes the input reference current Idin to vary. When a change in the input current Idin due to crosstalk noise is equal to or similar to a change in the reference current Idref due to the mitigation signal Mitref, the crosstalk noise contributes less or nothing to a difference between the input current Idin and the reference current Idref. Thus, the difference between the input current Idin and the reference current Idref may more accurately reflect the true input signal Input1.

Additionally or alternatively, the compensation circuit 509 may provide a mitigation signal Mitin to the input side of the differential pair. The mitigation signal Mitin may compensate for crosstalk noise such that changes in the input current Idin due to the crosstalk noise may be reduced or eliminated. Again, this may allow the difference between the input current Idin and the reference current Idref to more accurately reflect the true input signal Input1.

In some embodiments, the compensation circuit may include one or more transistors having a programmable effective width to adjust the influence of signals on different signal lines on a mitigation signal provided to a reference side of a differential pair. The compensation circuit may further include a coupling circuit that couples the reference side and an input side of the differential pair of the input receiver circuit. In some embodiments, the coupling circuit may include a low pass filter.

Figure 6:
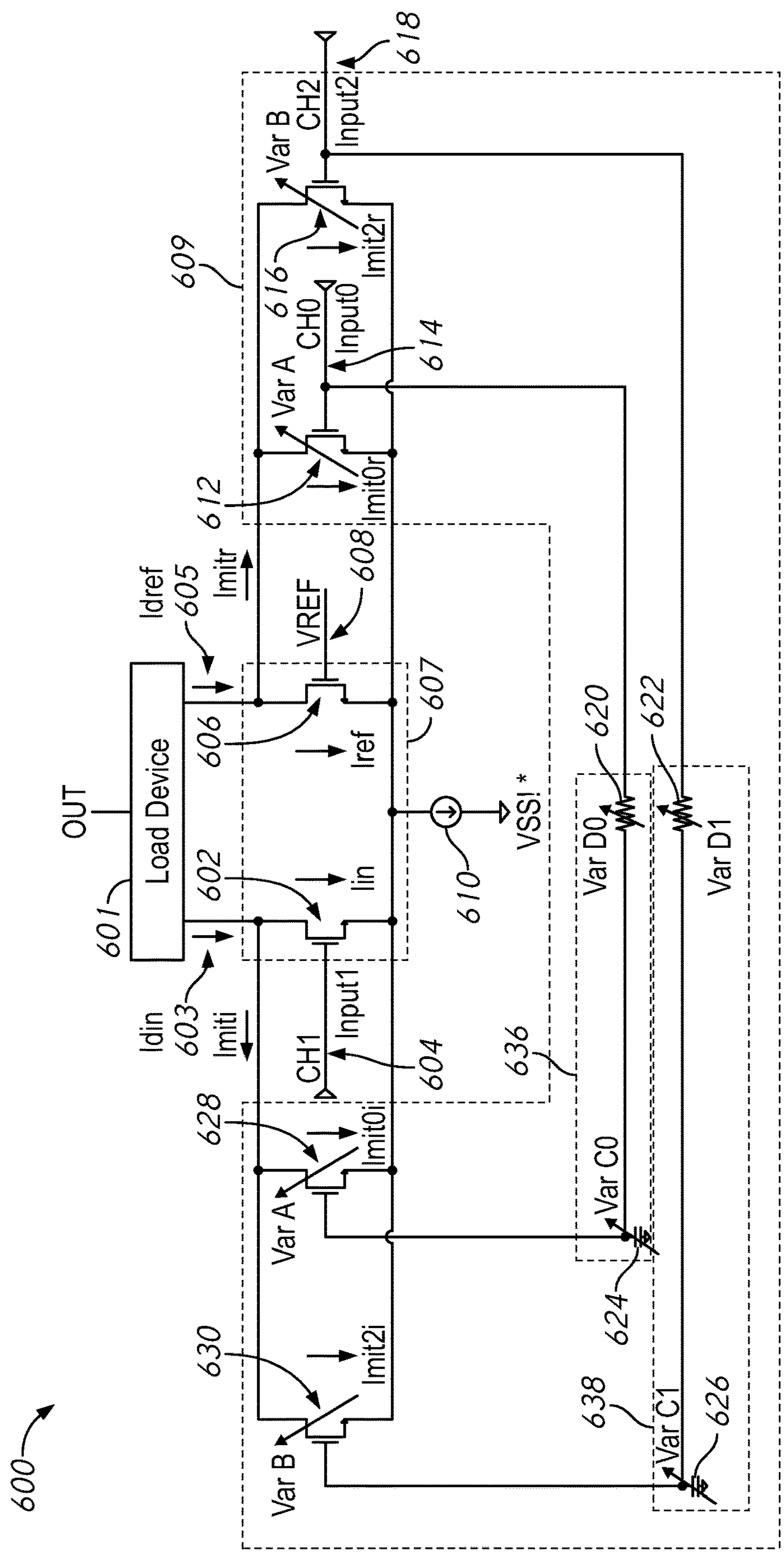
FIG. 6 is a circuit diagram of at least a portion of an input receiver circuit according to an embodiment of the present disclosure.

FIG. 6 is a circuit diagram of at least a portion of an input receiver circuit according to an embodiment of the present disclosure. In some embodiments, the input receiver circuit 600 may be included in input receiver circuit 310. In some embodiments, the input receiver circuit 600 may be used to implement the input receiver circuit 500. The input receiver circuit 600 may include a differential pair circuit 607 including transistor 602 and transistor 606. A node of transistor 602 and a node of transistor 606 may be coupled to a load device 601 of the input receiver circuit 600. The load device 601 may include one or more resistors, latches, transistors, and/or other devices. The load device 601 may receive a differential signal from the differential pair. In some examples, such as the one shown in FIG. 6 the differential signal may include current 603 (Idin) and current 605 (Idref). The load device 601 may provide an output signal OUT. In some embodiments, the output signal may be based, at least in part, on the differential signal provided by the differential pair. In some examples, the output signal OUT may have a voltage level indicating a logic level, similar to the output signals OUT0-OUTn shown in FIG. 3. In other examples, the output signal OUT may be provided to other components of the input receiver circuit 600 not shown that generate an output signal indicative of a logic level.

Another node of transistor 602 and another node of transistor 506 may be coupled to a bias current generator 610, which may be coupled to a common voltage-VSS in the example shown in FIG. 6. Currents 603 (Idin) and 605 (Idref) may flow through the transistors 602 and 606 to the bias current generator 610. The gate of transistor 602 may receive an input signal Input1 from a signal line CH1 at an input 604. Thus, the portion of the input receiver circuit 600 including transistor 602 may be referred to as the input side. In some embodiments, the input signal may be a data signal received via a DQ signal line. A gate of transistor 606 may receive a reference voltage VREF at an input 608. Thus, the portion of the input receiver circuit 600 including transistor 606 may be referred to as the reference side. In some embodiments, VREF may be provided by a voltage generator, such as voltage generator circuit 270.

The input receiver circuit 600 may include a compensation circuit 609. In some embodiments, the reference side of the compensation circuit 609 may include transistor 612 and transistor 616 coupled in parallel with transistor 606. A gate of transistor 612 may receive an input signal Input0 from a signal line CH0 at an input 614 and a gate of transistor 616 may receive an input signal Input2 from a signal line CH2. In some embodiments, signal lines CH0 and CH2 may be signal lines adjacent to signal line CH1, as shown in FIG. 4A. However, in other embodiments, signal lines CH0 and CH2 may have other spatial relationships with signal line CH1.

In some embodiments, the input side of the compensation circuit 609 may include transistor 628 and transistor 630 coupled in parallel with transistor 602. The compensation circuit 609 may include coupling circuits 636 and 638 to couple the reference and input sides of the compensation circuit 609. The gate of transistor 628 may receive the input signal from signal line CH0 via a coupling circuit 636. In some examples, such as the one shown in FIG. 6, the coupling circuit 636 may include a low pass filter including resistance 620 and capacitance 624. The gate of transistor 630 may receive the input signal from signal line CH2 via a coupling circuit 638. The coupling circuit may include a low pass filter including resistance 622 and capacitance 626, as in the example shown in FIG. 6.

In operation, the differential pair circuit 607 including transistors 602 and 606 provides a differential signal to the load device 601 based, at least in part, on the input signal Input1 on signal line CH1 and the reference voltage VREF. The load device 601 may detect a difference, for example, in the voltage between the reference side and the input side of the differential pair and/or detect a difference in a current Idin 603 flowing through the input side and a current Idref 605 flowing through the reference side of the differential pair. As noted previously, the difference between the currents may be used by the load device 601 to generate the output signal OUT.

Voltage changes on signal line CH0 and/or CH2 (e.g., the input signals are driven up or down) may introduce crosstalk noise in the input signal Input1 on signal line CH1. That is the input signal Input1 may be a sum of the "true" signal and the crosstalk noise (e.g., Input1=Input1True+Noise). When cross talk noise is introduced, the magnitude of the current Idin 603 changes as the current Iin across transistor 502 changes with the voltage changes of input signal Input1. Typically, current Idref 605 would remain constant due to the constant current Iref across transistor 606. However, due to compensation circuit 609, current Idref 605 is further based on current Imit0*r* across transistor 612 and current Imit2*r* across transistor 616. Currents Imit0*r* and Imit2*r* are influenced by changes in input signals Input0 and Input2, respectively. Similarly, due to compensation circuit 609, current din 603 is further based on current Imit0*i* across transistor 628 and current Imit2*i* across transistor 630. That is, Idref=Iref+Imit0*r*+Imit2*r* and Iin=Iin+Imit0*i*+Imit2*i*. The compensation circuit 609 may adjust currents Imit0*r*, Imit2*r*, Imit0*i*, and/or Imit2*i* to compensate for crosstalk noise on CH1 such that although Idref and Idin may change, a difference between Idref and Idin more closely reflect a difference due to the true input signal Input1 rather than the crosstalk noise.

In some embodiments, the amount the currents 603, 605 change are equal to and/or proportional to a weighted average of the input signals from the signal lines CH0-CH2. The weight applied to each signal may be based on an effective width of the device the input signal is provided to (e.g., transistors 602, 612, 616, 628, and/or 630). In some embodiments, the total width of the devices on the input side of the differential pair (e.g., transistors 602, 628, and 630) and the total width of the devices on the reference side of the differential pair (e.g., transistors 606, 612, and 616) may be matched (e.g., equal or nearly equal). In some embodiments, the total width of the devices on the input side of the differential pair and the total width of the devices on the reference side of the differential pair may be different.

As indicated by the diagonal arrows, transistors 612 and 628 may be programmable to set a variable Var A in some embodiments. Var A may correspond to an effective width of the transistors 612 and 628 included in the input receiver circuit 600. Similarly, transistors 616 and 630 may be programmable to set variable Var B, which may correspond to an effective width of the transistors 616 and 630 included in the input receiver circuit 600. Thus the total effective width of the transistors on the reference side of the differential pair may be equal to the total effective width of the transistors on the input side of the differential pair. The width of the transistors may determine, at least in part, how much an input signal from a signal line influences a magnitude of a mitigation signal generated by the input receiver circuit 600. For example, when Var A is set to a high value (e.g., a greater width of transistors 612 and 628 are included in the input receiver circuit 600), the input signal from signal line CH0 may have a greater influence on the mitigation signal than when Var A is set to a low value (e.g., a smaller width of transistors 612 and 628 are included in the input receiver circuit 600).

The values of Var A and Var B may be based, at least in part, to how much input signals Input0, Input2 on signal lines CH0 and CH2, respectively, contribute to crosstalk noise in the input signal Input1 on signal line CH1. For example, if the input signal Input0 on signal line CH0 generates more crosstalk noise on signal line CH1 than the input signal on signal line CH2, Var A may be greater than Var B. The crosstalk noise contributions may vary between signal lines for various reasons, for example, variations during manufacturing, differences in routing different signal lines, degree of capacitive coupling between the signal lines, or combinations thereof. If signal line CH0 and/or CH2 is found not to contribute to crosstalk noise on signal line CH1, Var A and/or Var B may be set to zero, which effectively removes the influence of the input signal on the respective signal line from the mitigation signal.

If a value for Var A and/or Var B is set too high, it may cause the input signal on signal line CH0 and/or signal line CH2 to contribute too much to the mitigation signal, thus, the mitigation signal may not have a magnitude that matches the crosstalk noise in the input signal of signal line CH1. Similarly, if a value for Var A and/or Var B is set too low, it may prevent the input signal on signal line CH0 and/or signal line CH2 that is causing crosstalk noise on signal line CH1 to sufficiently contribute to the mitigation signal, which again may cause the mitigation signal to not have a magnitude that matches (e.g., equals or approximates) the crosstalk noise in the input signal of signal line CH1.

Turning to the coupling circuits 636, 638, in some embodiments, resistance 620 and/or resistance 622 may be programmable to set variables Var D0 and/or Var D1, respectively, which may determine a magnitude of the resistance. The magnitude of resistance 620 may or may not be equal to the magnitude of resistance 622. Similarly, in some embodiments, capacitance 624 and/or capacitance 626 may be programmable to set variables Var C0 and/or Var C1, respectively, which may determine a magnitude of the capacitance. The magnitude of capacitance 624 may or may not be equal to the magnitude of capacitance 626. The resistances 620, 522 and/or capacitances 624, 626 may be programmed to set RC time constants of the low pass filters (e.g., Tau) such that providing the full magnitude of the mitigation signal to the input side of the differential pair circuit 607 is delayed with respect to a time the full magnitude of the mitigation signal is provided to the reference side of the differential pair circuit 607, as will be described with more detail with reference to FIG. 7. In some embodiments, the delay may be based, at least in part, on a time it takes the input signal Input1 on signal line CH1 to recover from the crosstalk noise.

If the RC time constant, which is determined by the values of Var C0, Var C1, Var D0, and Var D1, is incorrect, it may cause the full magnitude of the mitigation signal to be provided too quickly or too slowly to the input side of the differential pair circuit 607. However, even if the setting of the RC time constant is imperfect, in most cases, the mitigation signal may reduce the effect of the crosstalk noise in the input signal of signal line CH1.

The RC time constant of the coupling circuit 636 may be different than the RC time constant of the coupling circuit 638. Additionally, in some embodiments, one or more of the variables Var C0, Var C1, Var D0, and/or Var D1 may include multiple values (e.g., Var C0=[Var C00, Var C01]). One of the values may be used when an input signal on signal line CH0 or CH2 is driven in a first direction (e.g., low to high) and the other value may be used when the input signal on signal line CH0 or CH2 is driven in a second direction (e.g., high to low). In some embodiments, N-channel devices may be used to implement one of the values and P-channel devices may be used to implement the other one of the values (e.g., N-channel and P-channel capacitors for Var C0 and Var C1).

In some applications and/or architectures, programming Var C0 and Var C1 may be preferable to programming Var D0 and/or Var D1. That is, the resistance values of resistances 520, 522 may be fixed in some embodiments while the capacitance values of capacitances 524, 526 may be programmable. For example, if complementary metal oxide (CMOS) switches are used to implement programmable resistances and/or capacitances, capacitors may benefit from the full range of the gate-source voltage (Vgs) of the switches while CMOS switches may short-out resistor portions which may need to be booted to a higher voltage and may suffer variations due to varying Vgs.

In some embodiments, the variables Var A, Var B, Var C0, Var C1, Var D0, and Var D1 may be programmed by a device external to the memory device including the input receiver circuit 600, for example, a memory controller, such as controller 10. In some embodiments, the values of the variables may be set during a calibration routine (e.g., a DQ calibration routine) performed by the controller and/or memory device. In some embodiments, the values of the variables may be stored in one or more mode registers, such as mode register 230. In some embodiments, one or more of the variables may be set during manufacturing and/or testing of the device including the input receiver circuit 600. For example, Var D0 and/or Var D1 may be set during manufacturing and/or testing, and Var C0 and/or Var C1 may be set during a calibration routine.

Figure 7:
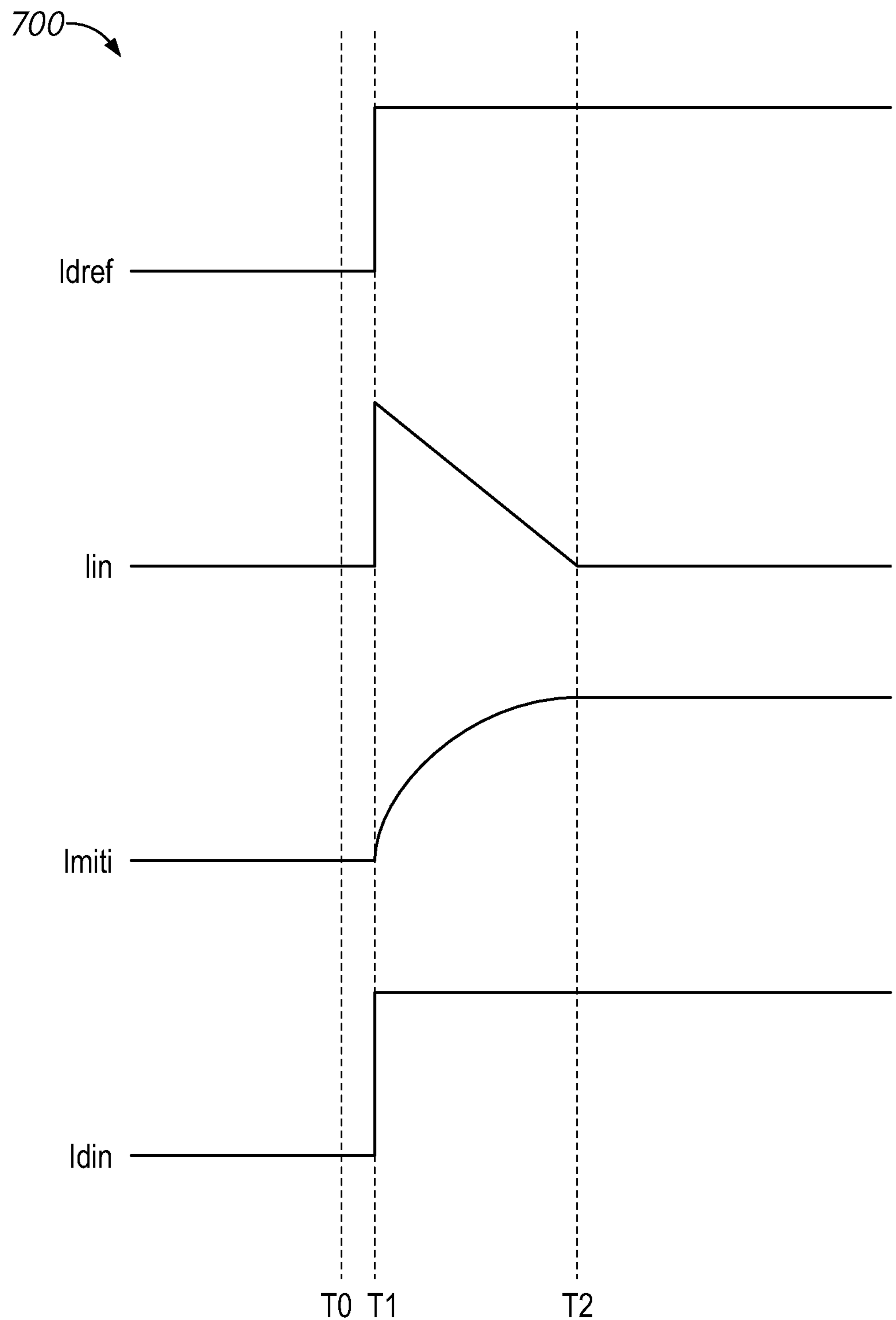
FIG. 7 is a timing diagram illustrating an example operation of an input receiver circuit including a compensation circuit according to an embodiment of the present disclosure.

FIG. 7 is a timing diagram illustrating an example operation of an input receiver circuit including a compensation circuit according to an embodiment of the present disclosure. In some embodiments, the timing diagram 700 may illustrate an example operation of input receiver circuit 600, and the signals shown in timing diagram 700 will be described with reference to input receiver circuit 600. However, the operation illustrated in FIG. 7 is not limited to the input receiver circuit 600.

The first line of timing diagram 700 illustrates the state of a current Idref on a reference side of a differential pair, such as current 605 Idref of differential pair circuit 607 in FIG. 6. The second line of timing diagram 700 illustrates the state of a current Iin across a transistor that receives an input signal on a signal line of the differential pair, such as current Tin across transistor 602. The third line of timing diagram 700 illustrates the state of a current Imiti due to a mitigation signal on an input side of the differential pair, such as current Imiti, which flows through transistors 630 and 628. The final line of timing diagram 700 illustrates the state of a current Idin on an input side of the differential pair, such as current 603 Idin of differential pair circuit 607.

In the example operation shown in timing diagram 700, voltages of input signal on a signal line CH1 of the input receiver circuit and voltages of input signals on other signal lines CH0, CH2 may be the same as shown in the example in FIG. 4B. At or around a time T0, the input signals on signal lines CH0 and CH2 may increase in voltage as shown in FIG. 4B. Due to crosstalk noise, at or around a time T1, an input signal on signal line CH1 may also increase. The current Iin may increase at or around time T1 responsive, at least in part, to the input signal on signal line CH1 increasing voltage, which increases the conductivity of transistor 602. At or around time T1, the current Iin may gradually decrease as the input signal on signal line CH1 recovers from the crosstalk noise. The current Iin may "recover" at or around a time T2.

Also at or around time T1, current Idref may increase. The increase in current Idref may be responsive, at least in part, to the increased voltages of the input signals on signal lines CH0 and CH2. The increase in voltages of the input signals may cause the conductivity of transistors 612 and 616 to increase, thus increasing currents Imit0*r* and Imit2*r*. Because Idref is equal to the sum of Iref, Imit0*r*, and Imit2*r*, Idref may increase even though VREF and Iref remain unchanged.

While the current Iin and Idref increase rapidly, at or around time T1, current Imiti gradually begins to increase. The gradual increase may be based, at least in part, on RC time constants of low pass filters of the coupling circuits 636, 638. The current Imiti may reach a maximum value (e.g., plateau) at or around time T2.

At or around time T1, Idin also increases. The current Idin is equal to the sum of Iin and Imiti. The influence of the rapid increase and gradual decay of Iin due to crosstalk noise may be mitigated by the gradual increase of Imiti. As a result, the change in Idin is similar to the change in Idref.

Thus, a difference between current Idin and current Idref may reflect (or more closely reflect) a difference due to a difference between a voltage of the "true" input signal (e.g., the input signal without the crosstalk noise) on signal line CH1 and the reference voltage VREF, not a difference due to crosstalk noise included in the input signal on signal line CH1 caused by voltage changes on signal lines CH0 and/or CH2. Based at least in part on the effect of the mitigation signal provided by currents Imiti0*r*, Imit2*r*, Imit0*i*, and/or Imit2*i*, the differential signal detected by a load device, such as load device 601, may be indicative of the state of the input signal on signal line CH1 without the crosstalk noise, which may allow the load device to detect/capture a correct logic state associated with the input signal on signal line CH1.

While the example compensation circuit 609 shown in FIG. 6 using low pass filters permits matching of transistors on both sides of the differential pair, the low pass filters of coupling circuits 636, 638 may allow the direct current (DC) level of the differential pair 607 to vary depending on the input signals on the signal lines CH0 and CH2. In some applications, maintaining a more stable DC level may be desirable. In some embodiments, the input receiver may include a high pass filter. In some embodiments, the high pass filter may capacitively couple inputs signals from the other signal lines to the reference side of a differential pair of the input receiver circuit. In some embodiments, the high pass filter may be coupled to a reference voltage. The high pass filter may maintain the DC level of the differential pair at a more stable level compared to the low pass filter example shown in FIG. 6.

Figure 8:
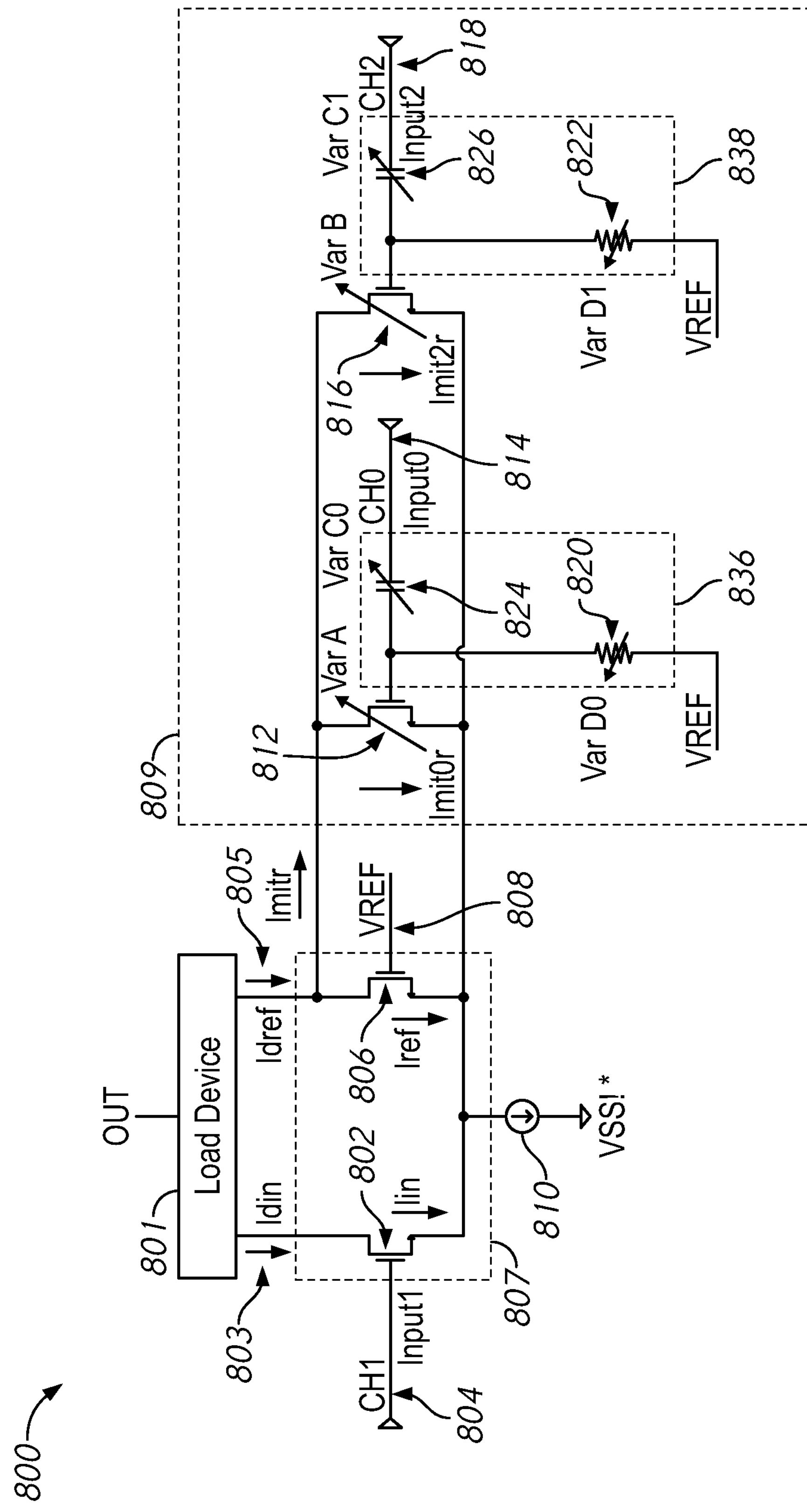
FIG. 8 is a circuit diagram of at least a portion of an input receiver circuit according to an embodiment of the present disclosure.

FIG. 8 is a circuit diagram of at least a portion of an input receiver circuit according to an embodiment of the present disclosure. In some embodiments, the input receiver circuit 800 may be included in input receiver circuit 310. In some embodiments, the input receiver circuit 800 may be used to implement input receiver circuit 500. The input receiver circuit 800 may include a differential pair circuit 807 including transistor 802 on an input side and transistor 806 on a reference side. A node of transistor 802 and a node of transistor 806 may be coupled to a load device 801 of the input receiver circuit 800. The load device 801 may include one or more resistors, latches, transistors, and/or other devices. The load device 801 may provide an output signal OUT. In some examples, the output signal OUT may have a voltage level indicating a logic level, similar to the output signals OUT0-OUTn shown in FIG. 3. In other examples, the output signal OUT may be provided to other components of the input receiver circuit 800 not shown that generate an output signal indicative of a logic level.

Another node of transistor 802 and another node of transistor 806 may be coupled to a bias current generator 810, which may be coupled to a common voltage-VSS in the example shown in FIG. 8. Current may flow from the load device 801 through the transistors 802 and 806 to the bias current generator 810. The gate of transistor 802 may receive an input signal from a signal line CH1 at an input 804. In some embodiments, the input signal may be a data signal received via a DQ signal line. A gate of transistor 806 may receive a reference voltage VREF at an input 808. In some embodiments, VREF may be provided by a voltage generator, such as voltage generator 270.

The input receiver circuit 800 may include a compensation circuit 809. In some embodiments, the compensation circuit 809 may include on the reference side transistor 812 and transistor 816 having nodes coupled in parallel with transistor 606. In contrast to the input receiver circuit 600 of FIG. 6, the compensation circuit 809 does not include additional devices on the input side of the differential pair circuit 807. A gate of transistor 812 may receive an input signal from a signal line CH0 at an input 814 via a coupling circuit 836 having a high pass filter including capacitance 824 and resistance 820. A gate of transistor 816 may receive an input signal from a signal line CH2 via a coupling circuit 838 having a high pass filter including capacitance 826 and resistance 822. The coupling circuits 836, 838 may be coupled to the reference voltage VREF. In some embodiments, signal lines CH0 and CH2 may be signal lines adjacent to signal line CH1, as shown in FIG. 4A. However, in other embodiments, signal lines CH0 and CH2 may have other spatial relationships with signal line CH1.

The compensation circuit 809 may generate a mitigation signal on the reference side of the differential pair that mitigates crosstalk noise present in the input signal on signal line CH1. The high pass filters of coupling circuits 836, 838 may pass transient changes in the input signals on signal lines CH0 and CH2, which may cause changes in the current 805 on the reference side of the differential pair that match the changes in current 803 on the input side of the differential pair due to crosstalk noise in the input signal on signal line CH1, as will be described in more detail with reference to FIG. 9.

Based, at least in part, to being coupled to VREF, while the coupling circuits 836, 838 may permit transient changes in Idref to match the transient changes in dmin due to crosstalk noise, the coupling circuits 836, 838 may trend the voltages applied to transistors 812 and 816 back toward VREF. Accordingly, the DC level of the input receiver circuit 800 may remain at or approximate to the reference voltage VREF. In contrast, the DC level of the input receiver circuit 600 varied based, at least in part, on changes in the levels of the input signals on signal lines CH0 and CH2. In some applications, maintaining a more stable DC operating level as provided by input receiver circuit 600 may be advantageous. For example, when the differential pair is designed to work best (e.g., provide a largest range of differential signals) at a particular DC operating level.

Similar to the input receiver circuit 600, the resistances and capacitances of resistances 820, 822 and/or capacitances 824, 826 may be programmable by setting variables Var D0, Var D1, Var C0, and/or Var C1. The values of the resistances and capacitances may determine the RC time constants of the high pass filters of coupling circuits 836, 838. As described with reference to FIG. 6, the RC time constant may be based at least in part on a recovery time of the input signal on signal line CH1.

Also similar to the input receiver circuit 600, the effective widths of transistor 812 and transistor 816 may be programmed by setting variables Var A and Var B, respectively. The widths may determine the degree of influence the input signals on signal lines CH0 and CH2 have on the magnitude of the mitigation signal. However, because there are no additional devices on the input side of the differential pair, the ranges and/or relative values of Var A and Var B may be such that the total effective width of transistors 806, 812, and 816 equal the width of transistor 802.

In some embodiments, the variables Var A, Var B, Var C0, Var C1, Var D0, and Var D1 may be programmed by a device external to the memory device including the input receiver circuit 800, for example, a memory controller, such as controller 10. In some embodiments, the values of the variables may be set during a calibration routine (e.g., a DQ calibration routine) performed by the controller and/or memory device. In some embodiments, the values of the variables may be stored in one or more mode registers, such as mode register 230. In some embodiments, one or more of the variables may be set during manufacturing and/or testing of the device including the input receiver circuit 800.

Figure 9:
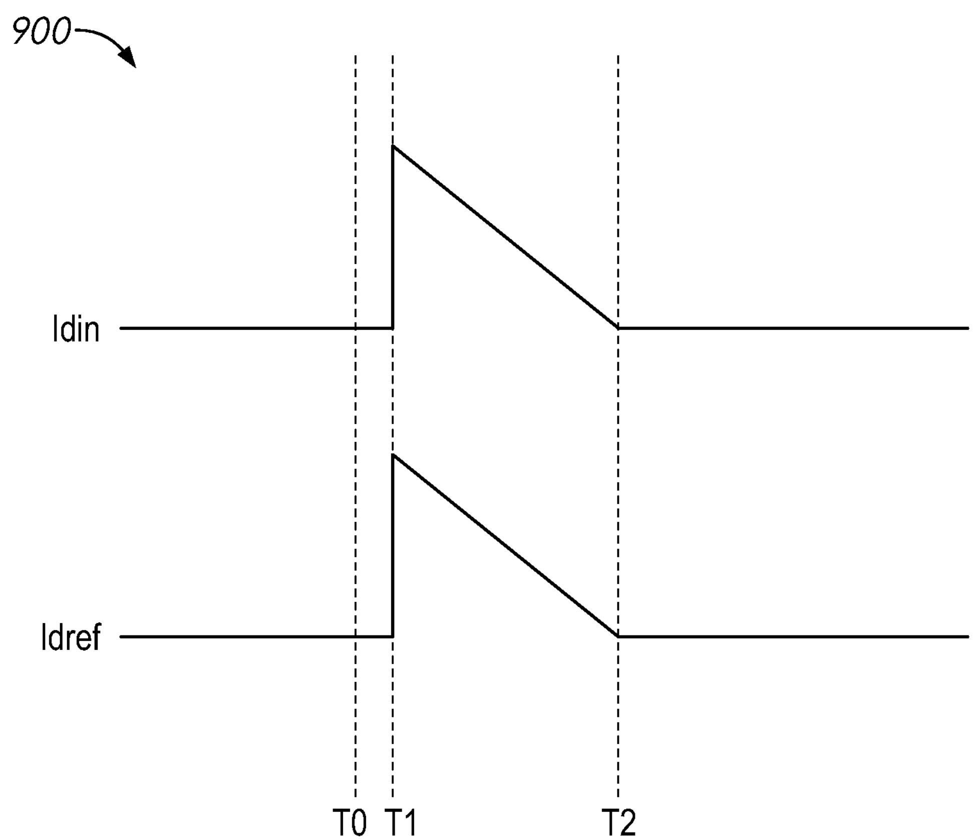
FIG. 9 is a timing diagram illustrating an example operation of an input receiver circuit including a compensation circuit according to an embodiment of the present disclosure.

FIG. 9 is a timing diagram illustrating an example operation of an input receiver circuit including a compensation circuit according to an embodiment of the present disclosure. In some embodiments, the timing diagram 900 may illustrate an example operation of input receiver circuit 800, and the signals shown in timing diagram 900 will be described with reference to input receiver circuit 800. However, the operation illustrated in FIG. 9 is not limited to the input receiver circuit 800.

The first line of timing diagram 700 illustrates the state of a current Idin on an input side of a differential pair, such as current 803 Idin of differential pair circuit 807. The second line of timing diagram 900 illustrates the state of a current Idref on a reference side of the differential pair, such as current 805 Idref of differential pair circuit 807 in FIG. 8.

In the example operation shown in timing diagram 900, voltages of input signal on a signal line CH1 of the input receiver circuit and voltages of input signals on other signal lines CH0, CH2 may be the same as shown in the example in FIG. 4B. At or around a time T0, the input signals on signal lines CH0 and CH2 may increase in voltage as shown in FIG. 4B. Due to crosstalk noise, at or around a time T1, an input signal on signal line CH1 may also increase. The current Idin may increase at or around time T1 responsive, at least in part, to the input signal on signal line CH1 increasing voltage, which increases the conductivity of transistor 802. At or around time T1, the current Idin may gradually decrease as the input signal on signal line CH1 recovers from the crosstalk noise. The current Idin may "recover" at or around a time T2.

Also at or around time T1, current Idref may increase. The increase in current Idref may be responsive, at least in part, to the increased voltages of the input signals on signal lines CH0 and CH2. The increase in voltages of the input signals may cause the conductivity of transistors 812 and 816 to increase, thus increasing currents Imit0*r* and Imit2*r*. Because Idref is equal to the sum of Iref, Imit0*r*, and Imit2*r*, Idref may increase even though VREF and Iref remain unchanged. At or around time T1, the current Idref gradually decreases due to the coupling circuits 836, 838 coupled between transistors 812, 816 and reference voltage VREF. The gradual decrease of Idref may be based, at least in part, on RC time constants of high pass filters of the coupling circuits 836, 838. Thus, Idref may approach an original state at or around time T2.

As shown in FIG. 9, a mitigation signal provided by Imit0*r* and Imit2*r* may cause Idref to increase by an amount equal to or approximate to an increase in din due to crosstalk noise in the input signal on signal line CH1. A difference between current Idin and current Idref may reflect (or more closely reflect) a difference due to a difference between a voltage of the "true" input signal (e.g., the input signal without the crosstalk noise) on signal line CH1 and the reference voltage VREF, not a difference due to crosstalk noise included in the input signal on signal line CH1 caused by voltage changes on signal lines CH0 and/or CH2. Thus, the differential signal detected by a load device, such as load device 801, may be indicative of the state of the input signal on signal line CH1 without the crosstalk noise, which may allow the load device to detect/capture a correct logic state associated with the input signal on signal line CH1.

As discussed, the additional transistors provided on one or both sides of the differential pairs of input receiver circuits 600 and 800 may be programmable to adjust the effective width of the transistors included in the input receiver circuits 600 and 800. Adjusting the width permits control over the current passing through the transistors and matching of total transistor widths on both sides of the differential pair. However, in some architectures, providing transistors with adjustable widths may be expensive or otherwise impractical. Accordingly, other techniques for controlling the current through the transistors may be desirable. In some embodiments, programmable bias current generators may be used to control the current through one or more of the transistors in an input receiver circuit.

Figure 10:
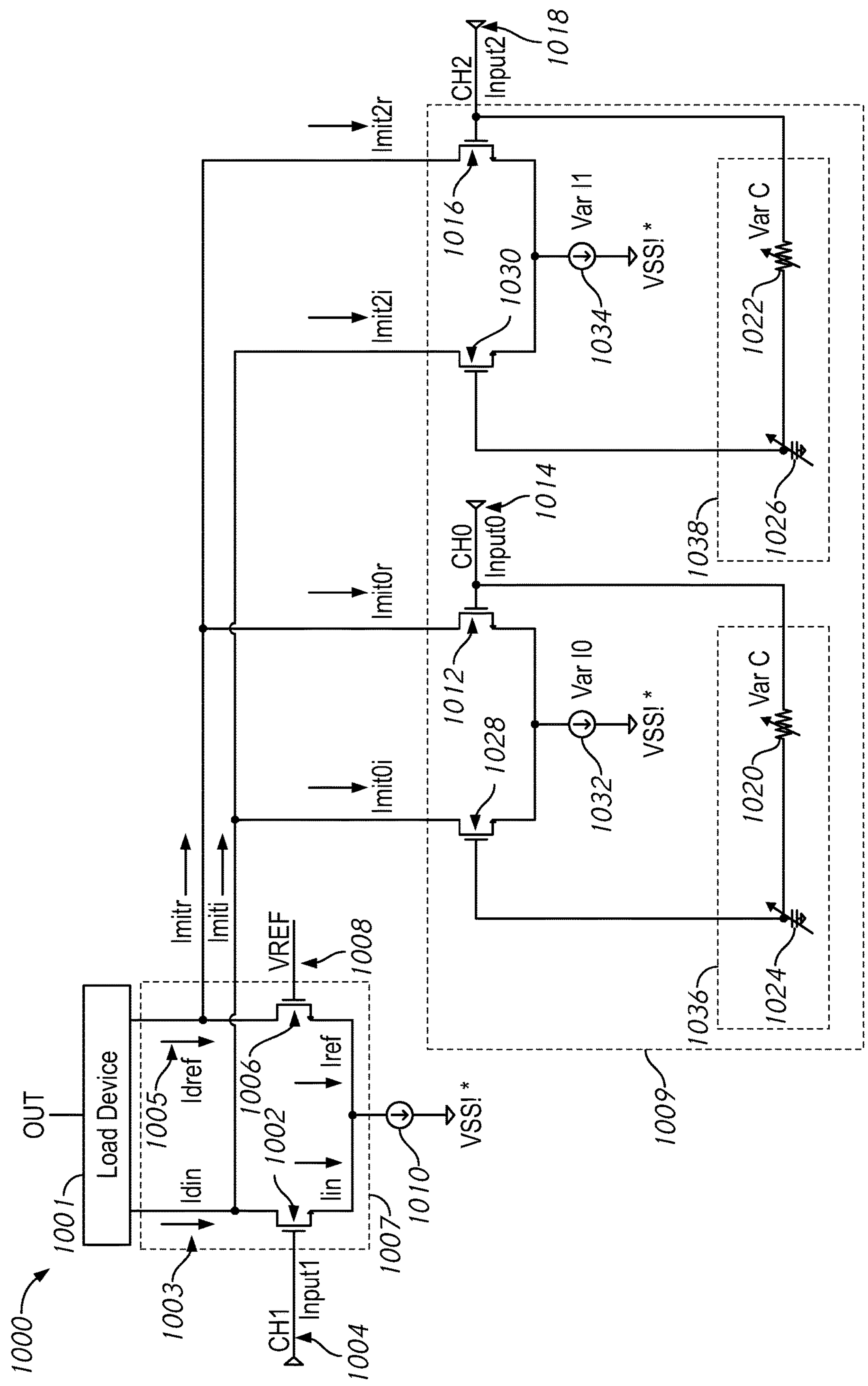
FIG. 10 is a circuit diagram of at least a portion of an input receiver circuit according to an embodiment of the present disclosure.

FIG. 10 is a circuit diagram of at least a portion of an input receiver circuit according to an embodiment of the present disclosure. In some embodiments, the input receiver circuit 1000 may be included in input receiver circuit 310. In some embodiments, the input receiver circuit 1000 may be used to implement input receiver circuit 500. The input receiver circuit 1000 may include a differential pair circuit 1007 including transistor 1002 on an input side and transistor 1006 on a reference side. A node of transistor 1002 and a node of transistor 1006 may be coupled to a load device 1001 of the input receiver circuit 1000. The load device 1001 may include one or more resistors, latches, transistors, and/or other devices. The load device 701 may provide an output signal OUT. In some examples, the output signal OUT may have a voltage level indicating a logic level, similar to the output signals OUT0-OUTn shown in FIG. 3. In other examples, the output signal OUT may be provided to other components of the input receiver circuit 1000 not shown that generate an output signal indicative of a logic level.

Another node of transistor 1002 and another node of transistor 1006 may be coupled to a bias current generator 1010, which may be coupled to a common voltage-VSS in the example shown in FIG. 10. Current may flow through the load device 1001 through the transistors 1002 and 1006 through the bias current generator 1010. The gate of transistor 1002 may receive an input signal from a signal line CH1 at an input 1004. In some embodiments, the input signal may be a data signal received via a DQ signal line. A gate of transistor 1006 may receive a reference voltage VREF at an input 1008. In some embodiments, VREF may be provided by a voltage generator, such as voltage generator 270.

Input receiver circuit 1000 may include a compensation circuit 1009 In some embodiments, the reference side of the compensation circuit 1009 may include transistor 1012 and transistor 1016 having nodes coupled to the node of transistor 1006 coupled to the load device 1001. Transistor 1012 may have a further node coupled to a bias current generator 1032 of the compensation circuit 1009 and transistor 1016 may have a further node coupled to a bias current generator 1034 of the compensation circuit 1009. A gate of transistor 1012 may receive an input signal from a signal line CH0 at an input 1014 and a gate of transistor 1016 may receive an input signal from a signal line CH2. In some embodiments, signal lines CH0 and CH2 may be signal lines adjacent to signal line CH1, as shown in FIG. 4A. However, in other embodiments, signal lines CH0 and CH2 may have other spatial relationships with signal line CH1.

In some embodiments, the input side of the compensation circuit 1009 may include transistor 1028 and transistor 1030 having nodes coupled to the node of transistor 1002 coupled to the load device 1001. Transistor 1028 may have a further node coupled to the bias current generator 1032 and transistor 1030 may have a further node coupled to the bias current generator 1034. The gate of transistor 1028 may receive the input signal from signal line CH0 via a coupling circuit 1036 having a low pass filter including resistor 1020 and capacitor 1024. The gate of transistor 1030 may receive the input signal from signal line CH2 via a coupling circuit 1038 having a low pass filter including resistor 1022 and capacitor 1026.

The input receiver circuit 1000 may operate in a similar manner to the input receiver circuit 600 shown in FIG. 6 to generate a mitigation signal to cancel the effects of crosstalk noise in the input signal on signal line CH1. However, in contrast to input receiver circuit 600, the widths of transistors 1012, 1016, 1028, and 1030 may be fixed. In some embodiments, the widths of transistors 1012, 1016, 1028, and 1030 may be selected such that the total width of the transistors on either side of the differential pair circuit 1007 are equal. Instead, magnitudes of bias currents provided by bias current generators 1032 and 1034 may be programmed by setting values for variables VarI0 and Var I1, respectively. Similar to the widths of the transistors, the magnitudes of the bias currents may determine a magnitude of a contribution to the mitigation signal input signals on signal line CH0 and CH2 provide. Thus, the bias currents provided by bias current generators 1032 and 1034 may be used to control the magnitude of the mitigation signal. That is, the bias current generators 1032 and 1034 may be used to alter a current 1005 flowing through the reference side of the differential pair circuit 1007 and the current 1003 flowing through the input side of the differential pair circuit 1007 to compensate for the effect of the crosstalk noise on the differential signal provided to the load device 1001. In some applications and/or architectures, it may be easier to adjust a magnitude of a bias current generated by a bias current generator than an effective width of a transistor.

Similar to the input receiver circuit 600, the resistances and capacitances of resistances 1020, 1022 and/or capacitances 1024, 1026 may be programmable by setting variables Var D0, Var D1, Var C0, and/or Var C1. The values of the resistances and capacitances may determine the RC time constants of the low pass filters 1036, 1038.

In some embodiments, the variables Var I0, Var I1, Var C0, Var C1, Var D0, and Var D1 may be programmed by a device external to the memory device including the input receiver circuit 1000, for example, a memory controller, such as controller 10. In some embodiments, the values of the variables may be set during a calibration routine (e.g., a DQ calibration routine) performed by the controller and/or memory device. In some embodiments, the values of the variables may be stored in one or more mode registers, such as mode register 230. In some embodiments, one or more of the variables may be set during manufacturing and/or testing of the device including the input receiver circuit 1000.

Figure 11:
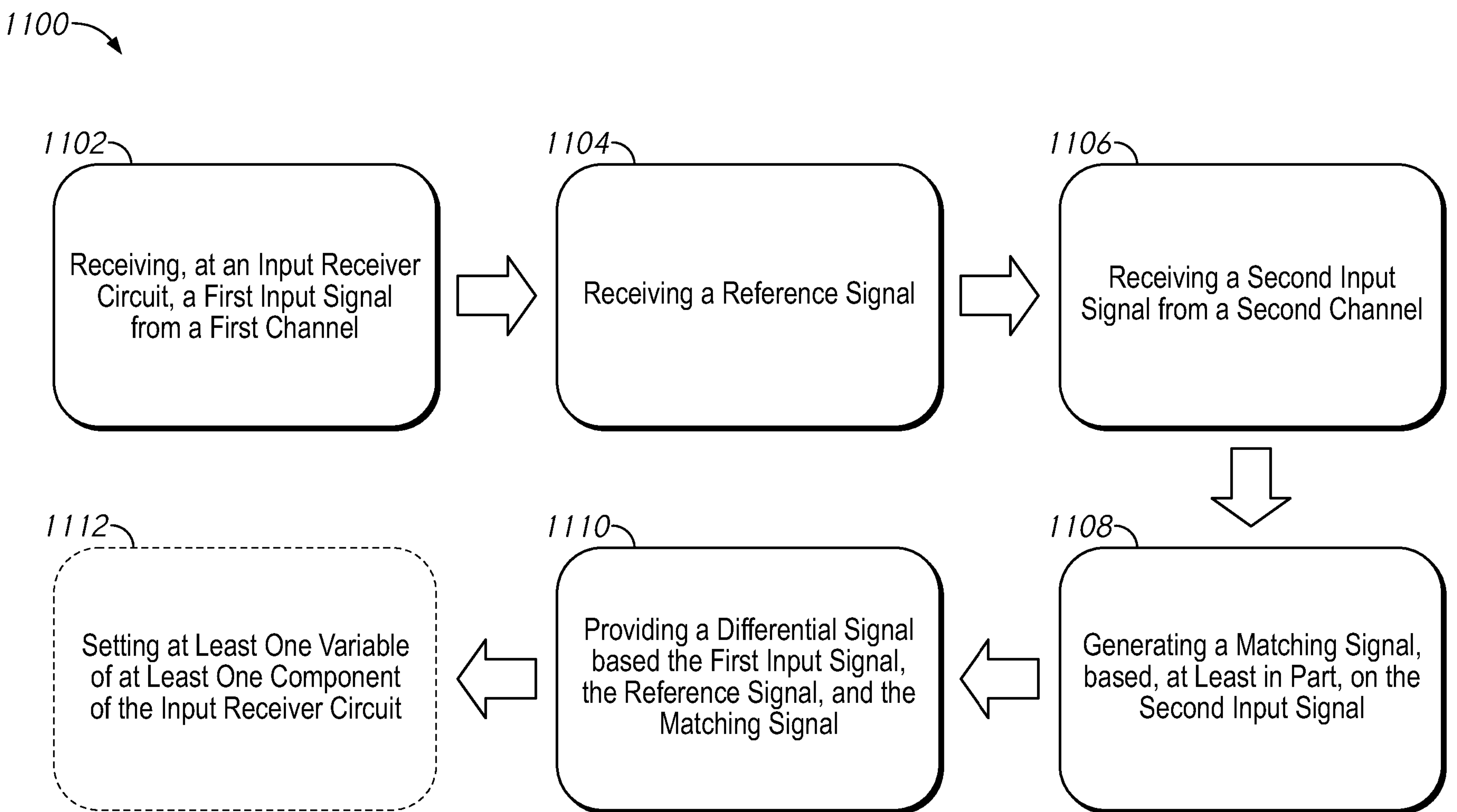
FIG. 11 is a flow chart of a method according to an embodiment of the disclosure.

FIG. 11 is a flow chart of a method according to an embodiment of the disclosure. In some embodiments, the method 1100 may be performed in whole or in part by a memory device, such as memory 110 and/or semiconductor memory device 200. In some embodiments, the method 1100 may be performed, in whole or in part, by an input receiver circuit, such as input receiver circuit 310, input receiver circuit 500, input receiver circuit 600, input receiver circuit 800, and/or input receiver circuit 1000.

At block 1102 "receiving, at an input receiver circuit, a first input signal from a first signal line" may be performed. In some embodiments, the input signal may be received at an input side of a differential pair of the input receiver circuit. At block 1104, "receiving a reference signal" may be performed. In some embodiments, the reference signal may be received at a reference side of the differential pair. In some embodiments, the reference signal maybe be a reference voltage. In some embodiments, the reference voltage may be provided by a reference voltage generator.

At block 1106, "receiving a second input signal from a second signal line" may be performed. In some embodiments, the second input signal may be received on the reference side of the differential pair. In some embodiments, the second input signal may be received at a transistor coupled to the reference side of the differential pair. In some embodiments, the second input signal may be capacitively coupled to the transistor by a capacitance of a high pass filter. In some embodiments, the second input may be received by a low pass filter coupled to the second input and the input side of the differential pair.

At block 1108, "generating a mitigation signal, based, at least in part, on the second input signal" may be performed. In some embodiments, the mitigation signal may have a magnitude and a duration based on a magnitude and a duration of a crosstalk noise signal on the first signal line. In some embodiments, the magnitude may be based, at least in part, on a degree of influence (e.g., degree of capacitive coupling) between the first signal line and the second signal line. In some embodiments, the duration may be based on a recovery time of the first signal on the first signal line.

At block 1110, "providing a differential signal based on the first input signal, the reference signal, and the mitigation signal" may be performed. In some embodiments, the differential signal may be received by a load device, such as load device 501, 601, 801, and/or 901. In some embodiments, the differential signal may be indicative of a difference between the first input signal and the reference signal without the influence of the crosstalk noise signal. That is, the generated mitigation signal may match the crosstalk noise signal and cancel out the effect of the crosstalk noise on the difference between the first input signal and the reference signal.

Optionally, at block 1112, "setting at least one variable of at least one component of the input receiver circuit" may be performed. In some embodiments, the at least one variable is based, at least in part, on at least one of a degree of capacitive coupling between the first signal line and the second signal line or a recovery time of the first input signal on the first signal line. In some embodiments, the setting may be performed by storing one or more values in a mode register. In some embodiments, the values may be stored in the mode register by another component of the memory device. In other embodiments, the values may be stored based, at least in part, by signals provided by a host system or a controller, such as controller 10. For example, the controller may provide values to be stored in the mode register along with a mode register write command. In some embodiments, the setting of the at least one variable may be performed during a calibration routine. In some embodiments, the at least one component comprises at least one of a transistor, a filter, or a bias current generator. In some embodiments, the at least one variable comprises at least one of an effective width of the transistor, a time constant of the filter, or a current of the bias current generator.

The apparatuses and methods disclosed herein may reduce effects due to crosstalk between signal lines. As disclosed herein, the input signals from the other signal lines may be used by an input receiver circuit to generate a mitigation signal, which may reduce or eliminate the effect of crosstalk noise in the input signal on the signal line. In some applications, reducing the effect of crosstalk noise may make it easier for input signals to meet predefined characteristics that specify voltage and/or times in which a signal must be present/not be present in order to be guaranteed to be successfully captured by an input receiver circuit.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus comprising:

a data input receiver circuit comprising:

a differential pair circuit configured to provide a differential signal, wherein the differential pair circuit comprises an input side configured to receive a first data signal from a first data signal line and a reference side configured to receive a reference signal from a reference input; and a compensation circuit configured to receive a second data signal from a second data signal line and generate a current on the reference side based, at least in part, on the second data signal, wherein the first data signal includes at least a portion of the second data signal and the current generated by the compensation circuit is configured to cancel at least a portion of the second data signal from the first data signal.

2. The apparatus of claim 1, wherein the compensation circuit comprises a transistor having a programmable effective width.

3. The apparatus of claim 1, wherein the compensation circuit comprises a coupling circuit configured to couple the input side of the differential pair circuit to the reference side of the differential pair circuit.

4. The apparatus of claim 3, wherein the compensation comprises a resistance.

5. The apparatus of claim 4, wherein the resistance is programmable.

6. The apparatus of claim 3, wherein the compensation comprises a capacitance.

7. The apparatus of claim 6, wherein the capacitance is programmable.

8. An apparatus comprising:

a data input receiver circuit comprising:

a differential pair circuit configured to provide a differential signal, wherein the differential pair circuit comprises an input side configured to receive a first data signal from a first data signal line and a reference side configured to receive a reference signal from a reference input; and a compensation circuit configured to receive a second data signal from a second data signal line and generate a current on the reference side based, at least in part, on the second data signal; and a second data input receiver circuit comprising a second differential pair circuit and a second compensation circuit, wherein the second data input receiver is configured to receive the second data signal at an input side of the second differential pair circuit and the first data signal at the second compensation circuit.

9. An apparatus comprising:

a first transistor configured to receive a first input signal from a first signal line, the first transistor coupled in parallel with a reference side of a differential pair;

a second transistor configured to receive a second input signal from a second signal line, the second transistor coupled in parallel with the reference side of the differential pair;

a first coupling circuit configured to receive the first input signal; and a second coupling circuit configured to receive the second input signal, wherein the first coupling circuit, the second coupling circuit, or both, comprise a low pass filter.

10. The apparatus of claim 9, further comprising the differential pair, wherein the differential pair further comprises an input side configured to receive a third signal.

11. The apparatus of claim 10, further comprising:

a first line configured to provide the first input signal;

a second line configured to provide the second input signal; and a third line configured to provide the third signal.

12. The apparatus of claim 11, wherein the first, second, and third lines comprise data lines.

13. The apparatus of claim 10, wherein the first coupling circuit is configured to couple the reference side to the input side of the differential pair and the second coupling circuit is configured to couple the reference side to the input side of the differential pair.

14. The apparatus of claim 9, wherein the first coupling circuit, the second coupling circuit, or both, comprise a bias current generator.

15. An apparatus comprising:

a first transistor configured to receive a first input signal from a first signal line, the first transistor coupled in parallel with a reference side of a differential pair;

a second transistor configured to receive a second input signal from a second signal line, the second transistor coupled in parallel with the reference side of the differential pair;

a first coupling circuit configured to receive the first input signal; and a second coupling circuit configured to receive the second input signal, wherein the first coupling circuit, the second coupling circuit, or both, comprise a high pass filter.

16. A method comprising:

receiving, at a first side of a differential pair, a first data signal from a first data signal line;

receiving, at a second side of a differential pair, a reference signal;

receiving, at a compensation circuit coupled between the first side and second side of the differential pair, a second data signal from a second data signal line capacitively coupled to the first data signal line; and generating a mitigation signal based, at least in part, on a capacitive coupling of the first data signal line and the second data signal line, wherein the first data signal includes at least a portion of the second data signal and the mitigation signal is configured to cancel at least a portion of the second data signal from the first data signal.

17. The method of claim 16, wherein the mitigation signal is further based on the second data signal.

18. The method of claim 16, further comprising setting an effective transistor width, a resistance, a capacitance, or a combination thereof of the compensation circuit.

* * * * *